United States Patent
Bucchignano et al.

[11] Patent Number: 6,043,003
[45] Date of Patent: Mar. 28, 2000

[54] E-BEAM APPLICATION TO MASK MAKING USING NEW IMPROVED KRS RESIST SYSTEM

[75] Inventors: James J. Bucchignano, Yorktown; Wu-Song Huang; Ahmad D. Katnani, both of Poughkeepsie, all of N.Y.; Kim Y. Lee, Fremont, Calif.; Wayne M. Moreau, Wappinger; Karen E. Petrillo, Mahopac, both of N.Y.

[73] Assignee: International Business Machines Corporation, Armonk, N.Y.

[21] Appl. No.: 09/356,309

[22] Filed: Jul. 16, 1999

Related U.S. Application Data

[62] Division of application No. 09/014,432, Jan. 27, 1998.

[51] Int. Cl.$^7$ .................................................. G03F 7/30
[52] U.S. Cl. ........................... 430/326; 430/905; 430/910
[58] Field of Search ..................................... 430/326, 905, 430/910

[56] References Cited

U.S. PATENT DOCUMENTS

| | | | |
|---|---|---|---|
| 4,491,628 | 1/1985 | Ito et al. | 430/176 |
| 4,940,646 | 7/1990 | Pawlowski | 430/175 |
| 5,219,699 | 6/1993 | Walls et al. | 430/156 |
| 5,258,257 | 11/1993 | Sinta et al. | 430/192 |
| 5,262,270 | 11/1993 | Walls | 430/156 |
| 5,275,907 | 1/1994 | Walls | 430/157 |
| 5,419,998 | 5/1995 | Mayes et al. | 430/288.1 |
| 5,585,220 | 12/1996 | Breyta et al. | 430/270.1 |
| 5,609,989 | 3/1997 | Bantu et al. | 430/270.1 |
| 5,670,299 | 9/1997 | Urano et al. | 430/326 |
| 5,759,750 | 6/1998 | Binder et al. | 430/326 |
| 5,876,900 | 3/1999 | Watanabe et al. | 430/288.1 |
| 5,882,835 | 3/1999 | Park et al. | 430/170 |

FOREIGN PATENT DOCUMENTS 0 749 044 A2   12/1996   European Pat. Off. .

*Primary Examiner*—John S. Chu
*Attorney, Agent, or Firm*—Scully, Scott, Murphy & Presser; Steven Capella, Esq.

[57] ABSTRACT

The present invention relates to chemically amplified resists and resist systems wherein some of the polar functional groups of the aqueous base soluble polymer or copolymers are protected with a cyclic aliphatic ketal protecting group such as methoxycyclohexanyl. The resists and the resist systems of the present invention containing the new protecting group have improved shelf-life and vacuum stability as compared to the prior art resists. Thus, the resists of the present invention are highly useful in e-beam lithographic applications.

19 Claims, No Drawings

E-BEAM APPLICATION TO MASK MAKING USING NEW IMPROVED KRS RESIST SYSTEM

RELATED APPLICATIONS

This application is a divisional of U.S. application Ser. No. 09/014,432 filed Jan. 27, 1998, allowed.

TECHNICAL FIELD

The present invention relates to chemically amplified resists and resist systems and, in particular, to a new class of acid labile protecting group for use with aqueous base soluble polymers or copolymers. The resists of the present invention containing the new acid labile protecting group when used as a coated film have improved shelf-life and vacuum stability as compared to prior art resists. Thus, the resists of the present invention are highly stable and are useful in e-beam lithographic applications wherein such problems typically arise.

BACKGROUND OF THE INVENTION

In the field of semiconductor manufacturing, lithography has been the main stream approach to pattern semiconductor devices. In typical prior art lithography process, a UV light is projected onto a silicon wafer coated with a thin layer of photosensitive resist through a mask that defines a particular circuitry pattern. Exposure to UV light, followed by subsequent baking, induces a photochemical reaction which changes the solubility of the exposed regions of the photosensitive resist. Thereafter, an appropriate developer, usually an aqueous base solution, is used to selectively remove the resist either in the exposed regions (positive-tone resists) or, in the unexposed region (negative-tone resists). The pattern thus defined is then imprinted on the silicon wafer by etching away the regions that are not protected by the resist with a dry or wet etch process.

Many of the currently available resists are chemically amplified resists which are made of two major components: The first component of such chemically amplified resists is an aqueous base soluble polymer which contains polar functional groups and acid labile protecting groups. The protected sites of the aqueous base soluble polymer convert the polymer into an aqueous insoluble polymer. The second major component of prior art chemically amplified resists is a photoacid generator. Exposure of these resists to UV irradiation typically generates a catalytic species as a result of the photochemistry of the acid precursor. The catalytic species is believed to induce a cascade of subsequent chemical transformations of the resist that alter the solubility of the exposed regions. Thus, the quantum efficiency of the photochemical event is amplified hundreds or even thousands of times through the catalytic chain reaction. The most commonly employed chemical amplification involves the acid catalyzed deprotection of various partially protected poly(p-hydroxystyrene) or poly(acrylic acid) for positive-tone resists. See, for example, U.S. Pat. Nos. 4,491,628 and 5,585,220.

In e-beam lithography applications, the chemically amplified resist is typically coated on a wafer and/or a quartz plate well in advance of mask formation. In the time between formation of the coating and pattenwise e-beam exposure of the resist coating in an e-beam exposure tool, the resist may undergo changes which effect its performance in the e-beam tool in an unpredictable manner. To avoid this shelf-life problem, the coated wafers or quartz plates are stored under vacuum or an inert gas to prevent contamination by water and/or air.

In addition to exhibiting shelf-life problems on storage of the resist-coated plate or wafer, the prior art resists may undergo alterations in the e-beam tool itself during the lithographic process. In e-beam processes, the lithographic pattern is formed by sequentially exposing small areas of the coated wafer or plate. The entire e-beam exposure process is typically carried out under high vacuum. Thus, the area of resist last exposed will spend a significantly less amount of time in high vacuum after being exposed to the e-beam relative to the areas of resist exposed at the beginning of the lithographic process. Problems arise where the properties of the resist in the last exposed areas are different from in the first exposed areas because of the difference in length of time in the vacuum.

In view of the above problems associated with prior art chemically amplified resists, it would be highly beneficial to provide a new and improved resist and resist system which do not exhibit any significant shelf-life or vacuum effect problems. Such a new resist and resist system would be especially beneficial in the field of e-beam lithography wherein such problems are generally found.

SUMMARY OF THE INVENTION

One object of the present invention relates to a chemically amplified resist that provides improved resist coating shelf life and with little or no vacuum effects on use.

Another object of the present invention relates to a chemically amplified resist or resist system that prevents air-borne contaminants from adversely effecting the chemical nature of the aqueous base soluble polymer or copolymer.

A further object of the present invention is to provide a packing method which prevents moisture as well as other acid and base contaminants from contacting a coated substrate, i.e., a wafer or quartz plate, that contains the chemically amplified resist system of the present invention as a thin film.

These and other objects and advantages can be achieved in the present invention by utilizing a cyclic aliphatic ketal substituent as an acid labile protecting group for an aqueous base soluble polymer or copolymer. In one aspect, the present invention relates to a chemically amplified resist system comprising (a) an aqueous base soluble polymer or copolymer having polar functional groups, wherein some, but not all of said polar functional groups are protected with a cyclic aliphatic ketal substituent having the formula RO—X—, wherein X is a substituted or unsubstituted cycloaliphatic group containing from about 3 to about 12 carbon atoms, and R is selected from the group consisting of a linear or branched alkyl containing from about 1 to about 12 carbon atoms, a cyclic alkyl containing from about 3 to about 12 carbon atoms and an aryl containing from about 6 to about 14 carbon atoms; (b) an acid generator; (c) a solvent for said base polymer or copolymer; (d) a base; and, optionally, (e) a surfactant.

It is emphasized that, in additional to containing the above-mentioned polar functional groups and the cyclic aliphatic ketal protecting groups, the aqueous base soluble polymer or copolymer also contains a polymer backbone including but not limited to: polyolefins, polyolefin sulfones, polyketones, polyethers and the like. The aqueous base soluble polymer or copolymer including the polar functional groups, the cyclic aliphatic ketal protecting groups and polymer backbone is referred to herein as the chemically amplified resist.

Preferred aqueous base soluble polymers or copolymers that can be employed in the present invention are those that have hydroxyl or carboxylate polar functional groups. A highly preferred aqueous base soluble polymer employed in the present invention is poly(p-hydroxystyrene) (PHS) whereas a highly preferred copolymer employed in the present invention is a copolymer of styrene and hydroxystyrene. The preferred cyclic aliphatic ketal protecting group employed in the present invention is methoxycyclohexanyl (MOCH).

Another aspect of the present invention relates to a method of preventing contaminants from contacting a coated substrate, e.g. wafer, quartz plate or mask membrane. In accordance with this aspect of the present invention, the method comprises the steps of: (a) providing a coated substrate containing a thin film comprising the chemically amplified resist system of the present invention formed thereon; and (b) sealing said coated substrate with a light impervious material and/or an air tight material. A preferred light impervious material is Al foil whereas a polyvinylidene copolymer such as SARAN (trademark) is employed as the air tight material.

A further aspect of the present invention relates to a method of creating a patterned resist on a coated substrate. In accordance with this aspect of the present invention, the chemically amplified resist of the present invention is applied to a substrate, as a thin film, and then the coated substrate is exposed to radiation, e.g. an e-beam.

DETAILED DESCRIPTION OF THE INVENTION

As stated above, the present invention provides a chemically amplified resist system that comprises components (a)–(d). The chemically amplified resist system of the present invention may also optionally include component (e), which is a surfactant. Component (a) of the present invention, i.e. the chemically amplified resist, comprises an aqueous base soluble polymer or copolymer having polar functional groups, e.g. hydroxyl or carboxlate, wherein some, but not all of said polar functional groups are protected with a cyclic aliphatic ketal substituent.

The aqueous base soluble polymers or copolymers employed in the present are typically well known to those skilled in lithography. Generally, the polymers and copolymers employed in the present invention are those that are capable of being dissolved in an alkaline solution and have polar functional groups that readily ionizes. Illustrative examples of suitable polymers that can be utilized in the present invention include, but are not limited to: phenolic-containing resins such as poly(p-hydroxystyrene) and phenol-formaldehydes; polymers having an acid or anhydride group, e.g. polymethacrylic acid with an ester side chain; and acrylamide, imide or hydroxyimide group type polymer.

Preferred polymer resins have an average molecular weight within the range of 1000 to 250,000, and preferably within the range of 1000 to 25,000, to enhance its solubility in developer solutions. A highly preferred polymer that can be employed as the aqueous base soluble polymer is poly (p-hydroxystyrene) (PHS). Other example of preferred polymers include poly-m-hydroxystyrene, poly-o-hydroxystyrene and substituted polymers thereof.

Examples of suitable copolymers that can be employed in the present invention are those which contain at least two of the following monomers: hydroxystyrenes, styrenes, acrylates, cyclohexanol, phenol-formaldehydes, methacrylates, acrylamides, maleic anhydride, maleimides, vinylnapthalene and anthracene. The copolymers employed in the present invention have the same molecular weight as expressed for the polymers. A highly preferred copolymer employed in the present invention is one which contains 30% styrene and 70% hydroxystyrene.

The aqueous base soluble polymers and copolymers employed in the present invention also contain a polymer backbone such as, but limited to: polyolefins, polyolefin sulfones, polyketones, polyethers and the like. A highly preferred polymer backbone for the aqueous based soluble polymers or copolymers is polyethylene.

The aqueous base soluble polymers or copolymers employed in the present invention are prepared using conventional techniques that are well known to those skilled in the art. This includes liquid or gas phase polymerizations or copolymerizations using cationic, anionic or radical catalysts as well as Ziegler-Natta catalysts.

In accordance with the present invention, some, but not all, of the polar functional groups of the aqueous base soluble polymers or copolymers are modified with the above-identified cyclic aliphatic ketal substituent, which is used herein as an acid labile protecting group. The cyclic aliphatic ketal protecting group employed in the present invention has the formula RO—X—, wherein X is a substituted or unsubstituted cycloaliphatic group containing from about 3 to about 12 carbon atoms, and R is selected from the group consisting of a linear or branched alkyl containing from about 1 to about 12 carbon atoms, a cyclic alkyl containing from about 3 to about 12 carbon atoms and an aryl containing from about 6 to about 14 carbon atoms. It is emphasized that the X portion of the cyclic aliphatic ketal substituent bonds directly to the soluble polymer or copolymer, not the R portion of the substituent.

The partially protected polymer or copolymer is prepared utilizing technique well known to those skilled in the art. For example, the partially protected polymer or copolymer is prepared by an acid catalyzed reaction of the cyclic aliphatic ketal with an aqueous base soluble polymer or copolymer.

Illustrative examples of unsubstituted cyclic aliphatic ketals that satisfy the above formula and thus can be employed in the present invention include: methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl, methoxyadamantyl and the like. Of these unsubstituted cyclic aliphatic ketals, it is highly preferred that methoxycyclohexanyl (MOCH) be employed as the acid labile protecting group of the aqueous base soluble polymer or copolymer.

When the hydrogen of the cycloaliphatic portions of the ketal substituent is substituted, it may be substituted with hydrophobic groups, so-called 'etch resistance' groups or combinations or mixtures thereof. Examples of hydrophobic groups that can be employed in the present invention are halogenated-containing groups such as —$CF_3$, —$CHF_2$, —$CH_2F$, —$CCl_3$, —$CHCl_2$ and —$CH_2Cl$, and silicon-containing groups such as —$Si(CH_3)_3$. When an etch resistance group is employed, the hydrogen of the cycloaliphatic group may be substituted with one or more of the following: styrene, metal-containing groups such as Sn Ti and Zn, and large bi- and tricyclic groups containing from about 6 to about 20 carbon atoms. Additional etch resistance can be obtained, if copolymers of hydroxystyrene, vinylnapthalene, vinylanthracene and the like are used.

As stated above, some, but not all, of the initial hydroxyl or carboxylate functional groups of the aqueous base soluble polymer or copolymer are protected with said cyclic aliphatic ketal substituent. Typically, the aqueous base soluble polymer contains from about 5 to about 95 mol % of said cyclic aliphatic ketal protecting group and the remainder being the initial, unprotected functional groups of the aqueous base soluble polymer or copolymer. More preferably, the aqueous base soluble polymer employed in the present invention contains from about 10 to about 35 mol % of said cyclic aliphatic ketal protecting group.

The photoacid generator used in the chemically amplified resist system of the present invention is a compound which generates a strong acid upon exposure to energy. The acid generator is commonly employed herein, as well as in the prior art, for the deprotection of the acid liable protecting group. Illustrative classes of such acid generators that can be employed in the present invention include, but are not limited to: nitrobenzyl compounds, onium salts, sulfonates, carboxylates, triphenyl sulfonium salts and the like. A highly preferred acid generator employed in the present invention is triphenylsulfonium triflate. Examples of photoacid generators are discussed in great length in U.S. Pat. No. 5,258,257 to Sinta, et al., the contents of which are incorporated herein by reference.

The solvents that are employed as component (c) of the chemically amplified resist system of the present invention are well known solvents that are employed in the prior art to dissolve aqueous base soluble polymers. Illustrative examples of such solvents include, but are not limited to: glycol ethers, aromatic hydrocarbons, ketones, esters and the like.

Suitable glycol ethers that can be employed in the present invention include: 2-methoxyethyl ether (diglyme), ethylene glycol monomethyl ether, propylene glycol monomethyl ether and the like. Examples of aromatic hydrocarbons that may be employed in the present invention include toluene, xylene and benzene; examples of ketones include methyl-ethyl ketone, cyclohexanone and cycloheptanone; and examples of esters include propylene glycol monomethyl ether acetate (PGMEA), ethyl lactate, and ethyl ethoxypropionate. Of the solvents mentioned hereinabove, it is preferred that an ester be employed, with PGMEA being the most preferred ester.

The bases employed in the present invention are well known bases whose function is to scavenge protons generated in the chemically amplified resist system. If no base is present, residual acid in the formulation will attack and release the acid labile moieties of the aqueous base soluble polymer or copolymer during storage of the resist, thereby decreasing performance of the resist during processing and shelf-life. However, the base additive should be present in the resist system of the present invention at a significant lower concentration than the acid generator, since it would be undesirable to have all protons generated during imaging trapped by the base additive.

Typical bases that can be employed in the present invention as component (d) include, but are not limited to: berberine, cetyltrimethylammonium hydroxide, 1,8-bis (dimethylamino)naphthalene, tetrabutyl ammonium hydroxide (TBAH), amines and the like. Of these bases, it is preferred that TBAH be employed in the present invention as the base component.

The surfactants that can optionally be employed in the present invention as those that are capable of improving the coating homogeneity of the chemically amplified resist of the present invention. Illustrative examples of such surfactants include: fluorine-containing surfactants such as 3M's-FC-430 and siloxane-containing surfactants such as Union Carbide's SILWET series and the like.

In accordance with the present invention, the chemically amplified resist system preferably comprises from about 1 to about 50 wt. % of component (a); from about 0.001 to about 12 wt. % of component (b); from about 50 to about 99 wt. % of component (c); and from about 0.0005 to about 6 wt. % of component (d). If a surfactant is present, it is present in an amount of from about 100 to about 1000 ppm. More preferably, the chemically amplified resist system of the present invention comprises from about 2 to about 30 wt. % of component (a); from about 0.002 to about 9 wt. % of component (b); from about 70 to about 98 wt. % of component (c); from about 0.001 to about 3 wt. % of component (d); and, if present, from about 250 to about 800 ppm of a surfactant.

The chemically amplified resist system of the present invention is typically applied onto a surface of a suitable substrate, i.e. Si-containing wafer or quartz plate, by coating applications well known to those skilled in art so that a thin film resist having a thickness of from about 0.1 to about 10 $\mu$m is achieved. A preferred technique used in forming the thin resist of the present invention is by spin-coating. The coated substrate (mask) is then employed as a resist in e-beam applications using conditions and techniques well known to those skilled in the art. The pattern is developed using conventional developers also well known to those skilled in the art. An example of a suitable developer that can be employed in the present invention is an aqueous solution of tetramethylammonium (TMAH), potassium hydroxide and sodium silicate.

As stated above, the chemically amplified resist and resist system of the present invention exhibit a longer shelf-life and no vacuum effects as compared to prior art resists. Typically, the prior art e-beam resists must be used within one day of coating to avoid shelf-life problems. In contrast, the shelf-life of the resists films containing the chemically amplified resist and resist system of the present invention is stable up to 3 or 4 months. This represents a significant improvement over prior art resists. Moreover, the resist films containing the inventive chemically amplified resist and resist system have higher resolution and light throughput than prior art resists. Additionally, when the cycloaliphatic portions of the acid labile protecting group is substituted with an etch resistance group, the resist film prepared therefrom is highly resistance to reactive ion etching.

Another aspect of the present invention relates to a method of preventing contaminants from contacting a coated substrate, e.g. wafer or quartz plate. In accordance with this aspect of the present invention, the method comprises the steps of: (a) providing a coated substrate having a thin film comprising the chemically amplified resist system of the present invention formed thereon; and (b) sealing said coated substrate with a light impervious material and/or an air tight material. Examples of light impervious material that can be employed in the present invention include: Al foil, tin foil, copper foil and the like. A highly preferred light impervious material employed in the present invention is Al foil. Illustrative examples of air tight material that can be employed in the present invention are polyethylene, polyvinylidene chloride (SARAN), poly(triflurochloroethylene) and the like. Of these materials it is preferred that a polyvinylidene chloride be employed as the air tight material.

In the present invention, it is preferred that the coated wafer or quartz plate by sealed with both materials, with the light impervious material being located next to or near the coated wafer or quartz plate and the air tight material surrounding the light impervious material. The coated plate or wafer could also be placed in an evacuated container or a container filled with dry, inert gas whereby the container consists of the light impervious material and/or the air tight material.

The following examples are given to illustrate the scope and spirit of the present invention. Because these examples are given for illustrative purposes only, the invention embodied therein should not be limited thereto.

EXAMPLE 1

Synthesis of 1-methoxycyclohexene (MOCH)

500 mg of p-toluene sulfonic acid monohydrate was placed in a 2000 ml flask. Under vacuum, the acid was heated with a heat gun to dry the glassware and to get rid of the hydrate from p-toluene sulfonic acid. Approximately 750 ml of dimethoxycyclohexane (from TCI America) was added to the acid and a silicon oil bath located beneath the 2000 ml flask was heated up to about 80°–90° C. The reaction was carried out overnight under vacuum to pump off the generated methanol. On the second day, the oil bath was raised up to about 110° C. to distill the 1-methoxycyclohexene. The purity of MOCH was determined by NMR to be about 95–100%.

EXAMPLE 2

Synthesis of 1-ethoxycyclohexene

The synthesis was the same as in Example 1 except that about 50 mg of p-toluene sulfonic acid and 50 ml diethoxycyclohexane (from Lancaster) were employed. Under vacuum overnight at about 90° C., some small amount of distilled liquid was discarded, then the temperature was raised up to 120°–130° C. and the 1-ethoxycyclohexene was collected through distillation.

EXAMPLE 3

Synthesis of Partially Methoxycyclohexene Protected Maruzen Polyhydroxystyrene (PHMC) (10% hydrogenated)

150 g of propylene glycol methyl ether acetate (PGMEA) was added to 50 g of PHMC and this mixture was stirred until a clear solution was obtained. The clear solution was then added in with approximately 30 mg of oxalic acid. After the acid was dissolved, 1-methoxy-cyclohexene was added to the solution, and the reaction was carried out at room temperature with stirring overnight. The reaction was then quenched with 5 g of basic active aluminum oxide. The protection level on the phenol group was determined by $C^{13}$ NMR. Some examples of the amount of 1-methoxycyclohexene vs. the protection level on the phenol group of PHMC are shown in the table below:

| Amount of MOCH added (g) | mole % protection on phenols |
| --- | --- |
| 9.4 | 8% |
| 14.9 | 14% |
| 17 | 17% |
| 18 | 18.5% |

The amount of protection level can be adjusted by adding extra amounts of MOCH to the solution to get higher protection or PHMC to reduce the protection level.

EXAMPLE 4

Synthesis of Partially Ethoxycyclohexene Protected PHMC

The same procedure as Example 3 was employed in this example. Specifically, about 150 g of PGMEA solution containing 25 wt. percent of PHMC was added in with about 35 mg of oxalic acid and 16.9 g of 1-ethoxycyclohexene. The reaction was quenched with 4 g of basic active aluminum oxide and showed 22 mole % protection on the phenol groups on the PHMC polymer.

EXAMPLE 5

Synthesis of Partially MOCH Protected Polyhydroxystyrene (HCCPHS)

The same procedure as described in Example 3 was employed in this example. Specifically, about 200 g of PGMEA solution containing 25 wt. percent of HCCPHS (100% homopolymer, from Hochest) was added in with about 35 mg of oxalic acid and 21 g of MOCH. The reaction was quenched with 5 g of basic active aluminum oxide and showed 33 mole % protection on the phenol groups of the PHS polymer.

EXAMPLE 6

Synthesis of Partially Methoxycyclooctene Protected PHMC

The same procedure as described in Example 3 was employed in this example. Specifically, about 52 g of PGMEA solution containing 25 wt. percent of PHMC was added in with about 35 mg of oxalic acid and 7.5 g of 1-methoxycyclooctene (from Frinton Laboratory). No reaction was observed between the polymer and 1-methoxycyclooctene even after reacting the same overnight. The NMR indicated that the reaction solution contained most of the unreacted 1-methoxycyclooctene. Stronger acids like trifluroacetic acid and p-toluenesulfonic acid were tried as catalysts without success. This experiment suggests that the steric effect of larger rings may have been the cause of the unsuccessful reaction. Therefore, it implies that protecting the monomer with 1-methoxycyclooctene before polymerization is the best approach in making the partially protected polymers with larger rings.

EXAMPLE 7

Synthesis of Partially MOCH Protected Styrene-hydroxystyrene Copolymer

The same procedure as described in Example 3 was employed in this example. Specifically, about 200 g of PGMEA solution containing 25 wt. percent of styrene-hydroxystyrene copolymer (CST, 32/68 mole ratio from Maruzen) was added in with about 35 mg of oxalic acid and 19.6 g of MOCH. The reaction was quenched with 5 g or basic active aluminum oxide and showed 22 mole % protection on the phenol groups of the PHS polymer.

EXAMPLE 8

Synthesis of Partially MOCH Protected Methyacrylate-hydroxystyrene Copolymer

The same procedure as described in Example 3 was employed in this example. Specifically, about 100 g of PGMEA solution containing 25 wt. percent of methacrylate-hydroxystyrene copolymer (CMM, 50/50, from Maruzen) was added in with about 35 mg of oxalic acid and 11.4 g of MOCH. The reaction was quenched with 4 g of basic active aluminum oxide and showed 41 mole % protection on the phenol groups of the PHS polymer.

EXAMPLE 9

Comparison of Resists Formulated with Methoxypropene (MOP) and MOCH Protected Polyhydroxystyrene in E-beam Exposure Resist formulations were all obtained by mixing partially protected polymers with 0.14 wt. % tetrabutyl ammonium hydroxide (TBAH) and 0.7 wt % triphenylsulfonium triflate (TPS) and 200–400 ppm of FC-430 surfactant in PGMEA solvent. The total solid weight content in the solution was about 15%. The resists were spin-coated on HMDS primed wafers. The film was baked on a hot plate at 110° C. for 3 minutes. The exposure were performed on IBM-built 50 KeV Gaussian-beam systems (VS-6). Polymers were all protected to approximately 24 mole % of the phenol units. Resists based on MOP protected polymers showed 100 nm resolution with 0.14 N TMAH aqueous base developer for 50s. No post exposure(PEB) was introduced. The film lost was around 100–200 angstrom film thickness. Resists based on MOCH protected polymers also showed 100 nm resolution with 0.263 N TMAH for 60s. It was not necessary to have PEB. A process of using 125° C./2 minutes PAB and 110° C./1 minute PEB and 0.263 N TMAH for 60s developing time did not show any thickness loss at all. This shows that the MOCH system has higher inhibition and higher thermal stability than prior art MOP system.

EXAMPLE 10

Comparison of Vacuum Effect Between MOP and MOCH System

The same set of resist formulations and processes as described in Example 7 were used in this example. Both MOP and MOCH resists showed no change in lithographic dose in vacuum for more than 24 hours without exposure and were taken out of the vacuum right after exposure. For the MOP system, the resist was exposed and remained in vacuum for 1, 2, 3, 4, 5 hours, respectively, before it was taken out of the vacuum. For comparison, a resist was taken out of the vacuum right after exposure. There was no change for the first 1–2 hours, however a slight change was observed thereafter. After about 5 hours, the dose of the resist shifted to 20% higher (less sensitive). However, for the MOCH system, no significant dose change was observed by keeping the exposed resist in the vacuum chamber of the e-beam tool for more than 5 hours.

EXAMPLE 11

Comparison of MOP and EOCH System on Resist Coated Wafer Stability

Two formulations were evaluated: one contained 0.7 wt. % TPS and 0.14 wt. % TBAH in the 25 mole % MOP protected HCCPHS, the other contained 0.7 wt. % TPS and 0.12 wt. % TBAH in the 22 mole % ethoxycycohexanyl protected PHMC. Both used PGMEA as solvent and FC-430 as surfactant. Both were processed with the same baking temperature at 110° C. for 90 seconds. Since the MOP system did not have enough inhibition, 0.14 N TMAH developer and 60 second developing time was used. The EOCH system used regular 0.263 N TMAH, 60 seconds developing process. Both resists were investigated by leaving the coated wafer in the regular lab environment for some time. The table below shows the film loss vs. the sitting time in the lab.

| Time sit | same day | 10 day | 20 day |
|---|---|---|---|
| HCCPHS-MOP | 292 Å | 731 Å | 1096 Å |
| PHMC-EOCH | 6 Å | 47 Å | 78 Å |

EXAMPLE 12

Comparison of PHMC and Styrene-hydroxystyrene Copolymers

Two resists were formulated with about 1.5 wt. % of TPS and 0.2 wt. % TBAH in the MOCH protected polymers using PGMEA solvent and 400 ppm FC-430 as surfactant. One was 24 mole % protected PHMC, and the other one was 22% of phenol unit protected styrene-hydroxystyrene copolymers (CST) (32/68 mole % ratio). These resists were investigated by leaving the coated wafer in the regular lab environment for some time and were then developed with 0.263 N TMAH developer for 60s. The table below shows the film loss vs. the sitting time in the lab.

| Time sit | same day | 1 day | 6 days | 8 days | 13 days | 20 days | 345 days |
|---|---|---|---|---|---|---|---|
| PHMC | 0 Å | 7 Å | 19 Å | 15 Å | 3 Å | 24 Å | all disolv. |
| CST | 0 Å | 2 Å | 1 Å | 17 Å | +8 Å | 5 Å | 3136 Å |

The first 20 days exhibited no film lost. PHMC polymer was dissolved away within 6–7s after 345 day, while CST polymer still retain some protection level and half of the film.

EXAMPLE 13

Lithographic Evaluations of Different Cyclic Ketals Protected PHMC 1-ethoxycyclohexane (EOCH) protected PHMC (22 mole % protection, Example 4) were evaluated against MOCH protected PHMC (18.5 mole % protection) using a 25 KeV Gaussian beam e-beam tool. Both resists were formulated with 0.7 wt. % TPS and 0.12 wt. % TBAH of the partially protected polymer and 200–400 ppm of FC-430 surfactant in PGMEA. Both resist coated wafers were processed with 125° C./120s PAB and 110° C./60s PEB and developed with 0.263N TMAH for 60 seconds. The EOCH resist systems showed slightly higher dose of 6.5 $\mu C./cm^2$ in comparison to the 5.5 $\mu C./cm^2$ of the MOCH resist system for 150 nm line and space resolution.

EXAMPLE 14

Lithographic Evaluations of Partially MOCH Protected Polymers

Different MOCH protected polymers were evaluated to see their difference in lithographic performance. Resist based on partially MOCH protected CST (Example 7) was formulated the same way as Example 13 except that 0.14 wt. % TBAH was used. This resist coated wafer was processed with 115° C./120s PAB and 110° C./60s PEB, then was exposed on a 50 KeV Gaussian-beam system (VS-6) using a dose of about 20 μC./cm and developed with 0.263N TMAH for 1 minute. SEM revealed 100 nm resolution on equal line and space of resist images.

Both MOCH protected HCCPHS (Example 5) and CMM (Example 8) resist systems were formulated, processed, and exposed exactly the same way as Example 13. Both showed 150 nm line and space resolution on resist images using 25 KeV e-beam exposure system.

EXAMPLE 15

Stability Studies of Resist Coated Wafers

KRS resist with a methoxycyclohexanyl (MOCH) protecting group on the ketal was evaluated for lithographic resolution and shelf life on a coated substrate. The resist was formulated with 0.7 wt. % TPS and 0.12 wt. % TBAH in the 18.5% MOCH protected polymer using PGMEA solvent and 400 ppm FC-030 as a surfactant. The process conditions were as follows: wafers were spin-coated at 3000 rpm to give a film thickness of 460 nm. The wafers were post apply baked (PAB) on a hot plate for 2 minutes at 125° C. They were exposed on a 25 KeV Gaussian beam e-beam tool using a dose of 5.5 μC./cm$^2$. After exposure, the wafers were given a post exposure bake (PEB) for 1 minute at 110° C. The wafers were then developed in 0.26 N TMAH developer for 1 minute. SEM micrographs were taken to evaluate resolution, and indicated that 150 nm equal lines and spaces were resolved, but in some cases the images were falling over. The 250 nm equal lines and spaces were resolved with good pattern integrity. Film thickness loss during the PEB and develop processes was measured to be 38 nm.

To test shelf-life on a coated substrate, the wafers were coated and given the PAB. The initial film thickness was measured, then the wafers were stored in single wafer carriers in a clean room storage area which was purged with nitrogen. No special filters were used in the lab. After various time intervals, wafers were removed from the storage area, exposed on the e-beam tool with the 5.5 μC/cm$^2$ dose, immediately given the PEB, and then developed. Resist thickness measurements were taken after development. SEM micrographs were then taken to evaluate resolution and linewidth. The following table summarizes the results of the shelf-life test for KRS-MOCH:

| KRS-MOCH Shelf Life | | | |
|---|---|---|---|
| Delay time (days) | 150 nm line/space (nm) | 250 nm line space (nm) | Resist loss (nm) |
| 0 | 111 | 250 | 38 |
| 4 | 135 | 246 | 57 |
| 15 | 118 | 270 | 110 |
| 35 | 98 | 246 | 186 |

From this table, it can be seen that resist loss at 15 days is the failure mechanism. Resolution is still good up to 35 days, but the linewidth varies over the 35 time frame, with significant linewidth slimming at the longest delay time.

This data can be compared to other prior art positive tone chemically amplified resist, UV3, which is a commercial resist based on hydroxystyrene and t-butyl acrylate copolymer. The data is summarized in the table below:

| UV3 Shelf-Life | | | |
|---|---|---|---|
| Delay time (days) | 150 nm line/space (nm) | 250 nm line space (nm) | Resist loss (nm) |
| 0 | 163 | 240 | 20 |
| 0.01 | 157 | 265 | |
| 0.17 | 158 | 263 | |
| 1 | 167 | 252 | |
| 5 | 155 | 274 | 23 |
| 7 | not resolved | not resolved | 20 |

With UV3, resist loss is not the failure mechanism as it was with KRS-MOCH. In this case, resolution due to resist scumming is the mode to failure, and it occurs after 5 days.

EXAMPLE 16

Method of Improving Coated Wafers and Masks Stability Through Packaging

To enhance the shelf-life of KRS-MOCH, wafers were stored in single wafer carriers which were sealed in plastic using a seal-a-meal. apparatus, then placed in a refrigerator for various lengths of time. In this manner, water vapor which was hypothesized to be an inhibitor to shelf-life for KRS-MOCH, could be greatly reduced.

| KRS-MOCH Shelf Life, Sealed and Refrigerated | | | |
|---|---|---|---|
| Delay time (days) | 150 nm line/space (nm) | 250 nm like/space (nm) | Resist loss (nm) |
| 1 | 111 | 250 | 38 |
| 24 | 114 | 244 | 58 |
| 45 | 108 | 238 | 61 |
| 62 | 114 | 231 | 47 |
| 95 | 83 | 208 | 53 |

It can be seen from this data that shelf-life is increased to 62 days based on linewidth data. Even at 95 days, resist loss is not the cause of shelf life failure. Linewidth slimming is the failure mechanism.

While the invention has been particularly shown and described with respect to preferred embodiments thereof, it will be understood by those skilled in the art that the foregoing and other changes in form and details may be made therein without departing from the spirit and scope of the present invention.

Having thus described our invention, what we claim as new and desire to secure by the Letters Patent is:

1. A method of creating a patterned resist on a coated substrate comprising providing a coated substrate having a thin film comprising a chemically amplified resist thereon, said chemically amplified resist comprising an aqueous polymer base soluble polymer or copolymer having polar functional groups, wherein some, but not all of said polar functional groups are protected with a cyclic aliphatic ketal substituent selected from the group consisting of methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl and methoxyadamantyl, exposing the coated substrate to radiation and developing to form a patterned resist.

2. The method of claim 1, wherein said radiation is an e-beam.

3. The method of claim 1, wherein said polar functional groups on said polymer or copolymer are replaced with from about 5 to about 95 mol % of said cyclic aliphatic ketal substituent.

4. The method of claim 3, wherein said polar functional groups are replaced with from about 10 to about 35 mol % of said cyclic aliphatic ketal substituent.

5. The method of claim 1, wherein said polar functional groups are hydroxyl or carboxlate functional groups.

6. The method of claim 1, wherein said polymer or copolymer further includes a polymer backbone, wherein said polymer backbone is selected from the group consisting of polyolefins, polyolefin sulfones, polyketones and polyethers.

7. The method of claim 6, wherein said polymer backbone is polyethylene.

8. The method of claim 1, wherein said polymer is a polymer capable of being dissolved in an alkaline solution and is selected from the group consisting of phenolic-containing resins, polymers having an acid or anhydride group, and acrylamide, imide or hydroxyimide group type polymers.

9. The method of claim 8, wherein said phenolic-containing resin is poly(p-hydroxystyrene), poly-m-hydroxystyrene, poly-o-hydroxystyrene or substituted polymers thereof.

10. The method of claim 1, wherein said copolymer contains at least two monomers selected from the group consisting of hydroxystyrenes, styrenes, acrylates, cyclohexanol, phenol-formaldehydes, methacrylates, acrylamides, maleic anhydrides maleimides, vinylnapthalene and vinyl anthracene.

11. The method of claim 10, wherein said copolymer contains 30% styrene and 70% hydroxystyrene.

12. The method of claim 11, wherein said cyclic aliphatic ketal is methoxycyclohexanyl.

13. The method of claim 1, wherein said cycloaliphatic portion of said cyclic aliphatic ketal is substituted with hydrophobic groups or etch resistance groups.

14. The method of claim 13, wherein said hydrophobic group is selected from the group consisting of halogenated-containing groups, silicon-containing groups and mixtures or combinations thereof.

15. The method of claim 14, wherein said halogenated containing group is selected from the group consisting of —$CF_3$, —$CHF_2$, —$CH_2F$, —$CCl_3$, —$CHCl_2$ and —$CH_2Cl$.

16. The method of claim 14, wherein the silicon-containing group is —$Si(CH_3)_3$.

17. The method of claim 13, wherein said etch resistance group is selected from the group consisting of styrene, metal-containing groups and large bi- and tricyclic groups containing from about 6 to about 20 carbon atoms.

18. The method of claim 1, wherein said chemically amplified resist is poly(p-hydroxystyrene) wherein some, but not all of the hydroxyl functionalities are protected with methoxycyclohexanyl.

19. The method of claim 1, wherein said chemically amplified resist is a copolymer containing 30% styrene and 70% hydroxystyrene, wherein some but not all, of the hydroxyl functionalities are protected with methoxycyclohexanyl.

* * * * *